(12) United States Patent
Hsieh et al.

(10) Patent No.: US 6,680,525 B1
(45) Date of Patent: Jan. 20, 2004

(54) STACKED STRUCTURE OF AN IMAGE SENSOR

(75) Inventors: Jackson Hsieh, Hsinchu Hsien (TW); Jichen Wu, Hsinchu Hsien (TW); Bruce Chen, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 0 days.

(21) Appl. No.: 10/340,251

(22) Filed: Jan. 9, 2003

(51) Int. Cl.[7] .............................................. H01L 23/02
(52) U.S. Cl. ...................... 257/680; 257/686; 257/678
(58) Field of Search ................................. 257/680, 686, 257/685, 723, 777, 787, 98, 678

(56) References Cited

U.S. PATENT DOCUMENTS

| | | | | |
|---|---|---|---|---|
| 5,952,714 A | * | 9/1999 | Sano et al. | 257/680 |
| 6,130,448 A | * | 10/2000 | Bauer et al. | 257/222 |
| 6,297,540 B1 | * | 10/2001 | Assadi et al. | 257/432 |
| 6,396,116 B1 | * | 5/2002 | Kelly et al. | 257/432 |
| 6,455,774 B1 | * | 9/2002 | Webster | 174/52.4 |
| 6,509,636 B1 | * | 1/2003 | Tsai et al. | 257/678 |
| 6,521,881 B2 | * | 2/2003 | Tu et al. | 257/680 |
| 6,531,341 B1 | * | 3/2003 | Peterson | 438/123 |
| 6,545,332 B2 | * | 4/2003 | Huang | 257/433 |
| 6,590,269 B1 | * | 7/2003 | Chuang et al. | 257/704 |
| 2002/0173071 A1 | * | 11/2002 | Tu et al. | 438/106 |

* cited by examiner

*Primary Examiner*—Jasmine Clark
(74) *Attorney, Agent, or Firm*—Pro-Techtor Inter-National Services

(57) ABSTRACT

An image sensor to be mounted to a printed circuit board. The module includes a substrate, an integrated circuit, a frame layer, a photosensitive chip, a plurality of wires, and a transparent layer. The substrate is composed of metal sheets arranged in a matrix, and a middle board positioned in a central region surrounded by the metal sheets. Each metal sheet has a first board and a second board connected to the printed circuit board. A slot is formed under the substrate. The integrated circuit is arranged within the slot and electrically connected to the substrate. The chip is placed on the middle board. The wires electrically connect the first boards, to the chip. The transparent layer is placed on the frame layer to cover the chip.

8 Claims, 2 Drawing Sheets

STACKED STRUCTURE OF AN IMAGE SENSOR

BACKGROUND OF THE INVENTION

1. Field of the Invention

The invention relates to a stacked structure of an image sensor, and more particularly to an image sensor in which one of various integrated circuits with different functions and a photosensitive chip may be integrally packaged into a package body so that the material for the package substrate may be reduced.

2. Description of the Related Art

A general sensor is used for sensing signals that may be image signals or audio signals. The sensor of the invention is used to receive image (optical) signals and convert the image signals into electrical signals that are to be transmitted to a printed circuit board.

The image sensor is further electrically connected to other packaged integrated circuits in order to possess various functions. For example, the image sensor may be electrically connected to a digital signal processor which is used to process the signals generated by the image sensor. Furthermore, the image sensor may be electrically connected to a micro controller or a central processing unit to possess various functions.

However, a conventional image sensor is individually packaged. Thus, various integrated circuits mating with the image sensor have to be individually packaged with the image sensor. The packaged image sensor and various signal processing units are then electrically connected to the printed circuit board via a plurality of wires. In this structure, a substrate and a package body have to be used when each of the signal processing units and the image sensor are individually packaged, thereby increasing the manufacturing costs. Furthermore, when each of the signal processing units is mounted to the printed circuit board, the required area of the printed circuit board is relatively large. Thus, the products cannot be made thin, small, and light.

SUMMARY OF THE INVENTION

An object of the invention is to provide a stacked structure of an image sensor, in which the number of package members may be reduced, and the package cost may be lowered.

Another object of the invention is to provide a stacked structure of an image sensor, in which the manufacturing processes may be simplified and facilitated.

Still another object of the invention is to provide a stacked structure of an image sensor capable of reducing the area of the image sensor product.

Yet still another object of the invention is to provide a stacked structure of an image sensor capable of lowering the package and test costs of the image sensor product.

To achieve the above-mentioned objects, the invention provides a stacked structure of an image sensor to be mounted to a printed circuit board. The image sensor includes a substrate, an integrated circuit, a frame layer, a photosensitive chip, a plurality of wires, and a transparent layer. The substrate is composed of a plurality of metal sheets arranged in a matrix, and a middle board positioned in a central region surrounded by the metal sheets. Each of the plurality of metal sheets has a first board and a second board positioned at a different height from that of the first board. A slot is formed under the substrate. The integrated circuit is arranged within the slot under the substrate and electrically connected to the substrate. The frame layer surrounds the substrate and the integrated circuit. The first boards and second boards are exposed out of the frame layer, and the second boards are electrically connected to the printed circuit board. The photosensitive chip is placed on the middle board of the substrate. The wires electrically connect the first boards to the photosensitive chip. The transparent layer is placed on the frame layer to cover the photosensitive chip.

According to above-mentioned structure, the image sensor and integrated circuit may be integrally packaged.

DETAILED DESCRIPTION OF THE INVENTION

Figure 1:
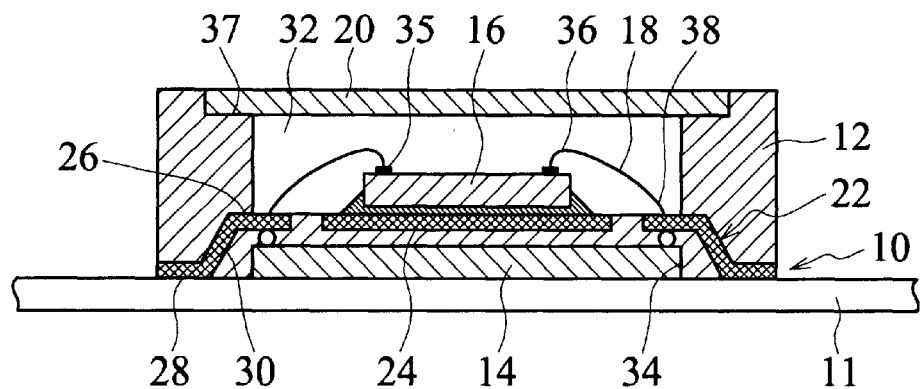
FIG. 1 is a cross-sectional view showing a stacked structure of an image sensor of the invention.

Referring to FIG. 1, a stacked image sensor module of the invention includes a substrate 10, a frame layer 12, an integrated circuit 14, a photosensitive chip 16, a plurality of wires 18, and a transparent layer 20.

The substrate 10 is composed of a plurality of metal sheets 22 arranged in a matrix, and a middle board 24 positioned in a central region surrounded by the metal sheets 22. Each of the plurality of metal sheets 22 has a first board 26, a second board 28, and a third board 30 connecting the first board 26 to the second board 28. The middle board 24 and the first boards 26 are positioned at the same horizontal height, the second boards 28 are electrically connected to a printed circuit board 11 to transmit signals to the printed circuit board 11.

The frame layer 12 is formed into a U-shaped structure by injecting a thermal plastic material to the plurality of metal sheets 22 and the middle board 24. Thus, a frame structure is formed on a periphery of the substrate 10, and a cavity 32 is formed above the middle board 24. The frame layer 12 encapsulates the metal sheets 22 with the first boards 26 and the second boards 28 are exposed out of the frame layer 12. A slot 34 is formed under the substrate 10, and a recess 37 is formed at a top of the frame layer 12. It is to be noted that the plurality of metal sheets 22 and the middle board 24 may be integrally formed by way of press forming.

The integrated circuit 14 is a signal processor arranged within the slot 34 under the substrate 10, and is electrically connected to bottom surfaces of the first boards 26 of the substrate 10 in a flip-chip manner. Hence, signals may be transmitted to the substrate 10.

The photosensitive chip 16, on which a plurality of bonding pads 35 are formed, is placed on the middle board 24 of the substrate 10 and is positioned within th cavity 32.

Each of the wires 18 has a first end 36 and a second end 38. The first ends 36 are electrically connected to the bonding pads 35 of the photosensitive chip 16, and the second ends 38 are electrically connected to the first boards 26 of the metal sheets 22, respectively. Accordingly, signals from the photosensitive chip 16 may be transmitted to the substrate 10, and then to the printed circuit board 11 via the second boards 28 of the substrate 10.

The transparent layer 20 is a piece of transparent glass covering over the recess 37 of the frame layer 12 to cover the photosensitive chip 16. Then, the photosensitive chip 16 may receive optical signals passing through the transparent layer 20.

The method for manufacturing the module of the invention will be described in the following.

Figure 2:
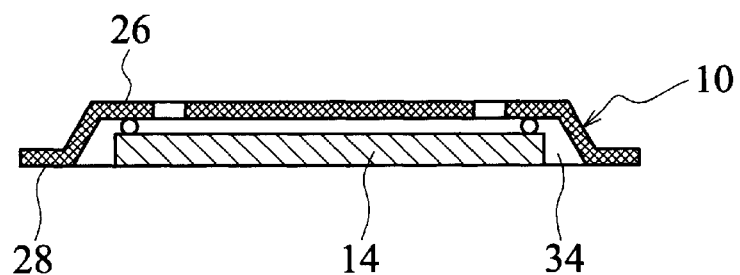
FIG. 2 is a schematic illustration showing the stacked structure of the image sensor during a first process of the invention.

As shown in FIG. 2, the integrated circuit 14 is first placed within the slot 34 under the substrate 10, and is electrically connected to the bottom surfaces of the first boards 26 of the substrate 10 in a flip-chip manner.

Figure 3:
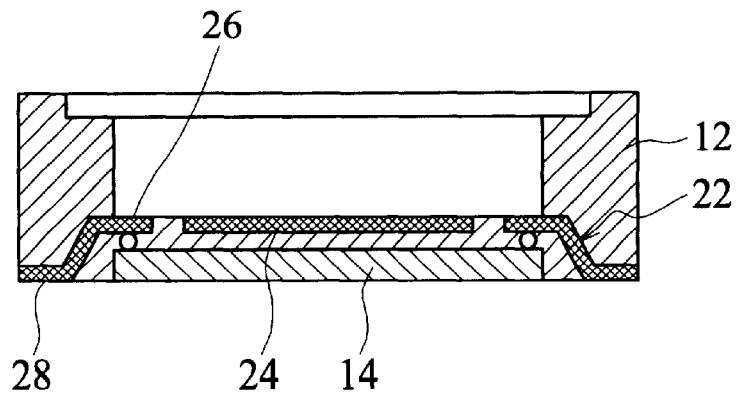
FIG. 3 is a schematic illustration showing the stacked structure of the image sensor during a second process of the invention.

Then as shown in FIG. 3, the thermal plastic materials is injected to the metal sheets, using an injection mold, to form a U-shaped frame layer 12 having a frame structure on a periphery of the substrate 10. The frame layer 12 also surrounds the integrated circuit 14, and the first boards 26 and second boards 28 of the metal sheets 22 of the substrate 10 are exposed out of the frame layer 12 so that the second boards 28 may be electrically connected to the printed circuit board.

Figure 4:
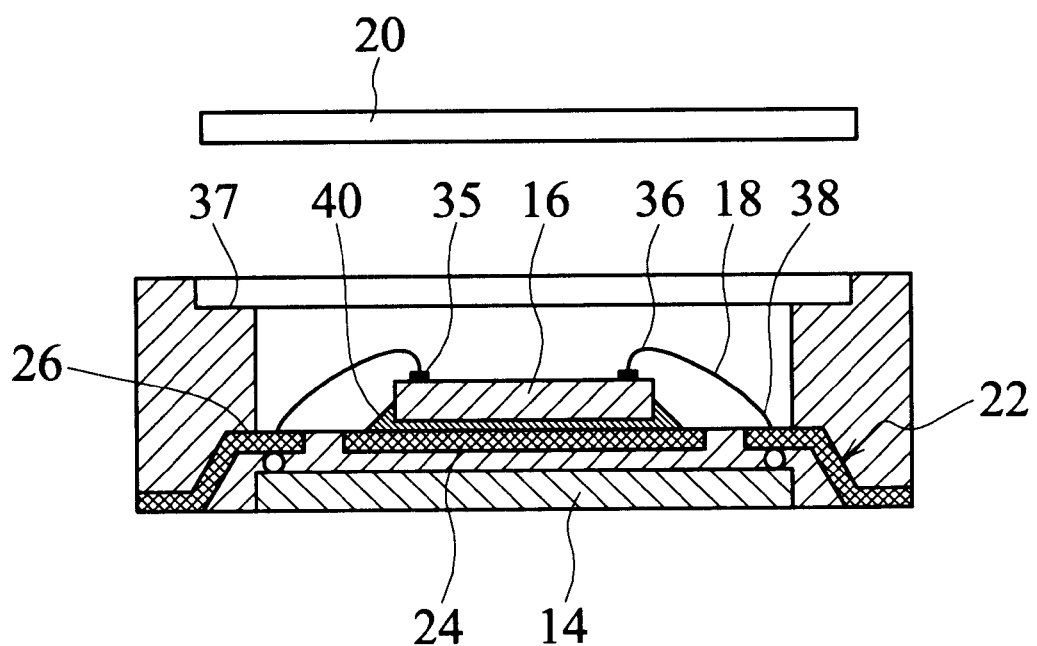
FIG. 4 is a schematic illustration showing the stacked structure of the image sensor during a third process of the invention.

Next, as shown in FIG. 4, the photosensitive chip 16 is adhered to the middle board 24 of the substrate 10 by an adhesive 40. The first ends 36 of the wires 18 are electrically connected to the bonding pads 35 of the photosensitive chip 16, while the second ends 38 are electrically connected to the first boards 26 of the substrate 10, respectively. Then, the transparent layer 20 is placed within the recess 37 of the frame layer 12 to cover the photosensitive chip 16. Thus, the photosensitive chip 16 may receive optical signals passing through the transparent layer 20.

The module of the invention has the following advantages.

1. Because the photosensitive chip 16 and the integrated circuit 14 are integrally packaged, the material of the substrate 10 may be reduced. Therefore, the manufacturing cost of the image sensor product may be lowered.

2. Because the photosensitive chip 16 and the integrated circuit 14 are integrally packaged, the area of the image sensor product may be reduced.

3. Because the photosensitive chip 16 and the integrated circuit 14 are integrally packaged into a package body, only one test jig is needed for the test. Hence, the test cost may be reduced.

4. Because the photosensitive chip 16 and the integrated circuit 14 are integrally packaged, only one package process is needed to package two chips. Hence, the package cost may be effectively reduced.

5. Because the integrated circuit 14 is placed within the slot 34 of the substrate 10, the packaged volume of the module may be reduced to meet the miniaturized requirement.

While the invention has been described by way of an example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. An image sensor to be mounted to a printed circuit board, the image sensor comprising:

a substrate composed of a plurality of metal sheets arranged in a matrix, and a middle board positioned in a central region surrounded by the metal sheets, each of the plurality of metal sheets having a first board and a second board positioned at a different height from that of the first board, and a slot being formed under the substrate;

an integrated circuit arranged within the slot under the substrate and electrically connected to the substrate;

a frame layer surrounding the substrate and the integrated circuit, the first boards and second boards being exposed out of the frame layer, and the second boards being electrically connected to the printed circuit board;

a photosensitive chip placed on the middle board of the substrate;

a plurality of wires for electrically connecting the first boards to the photosensitive chip; and a transparent layer placed on the frame layer to cover the photosensitive chip.

2. The image sensor according to claim 1, wherein the frame layer is formed of a thermal plastic material by way of injection molding.

3. The image sensor according to claim 1, wherein each of the metal sheets further has a third board connecting the first board to the second board.

4. The image sensor according to claim 1, wherein the transparent layer is a piece of transparent glass.

5. The image sensor according to claim 1, wherein the plurality of metal sheets and the middle board are integrally formed by way of press forming.

6. The image sensor according to claim 1, wherein the integrated circuit is a signal processor.

7. The image sensor according to claim 1, wherein the middle board and the first board are positioned at the same horizontal height.

8. The image sensor according to claim 1, wherein the integrated circuit is electrically connected to the first boards of the substrate in a flip-chip manner.

* * * * *